United States Patent [19]
Matsubara

[11] Patent Number: 5,959,900
[45] Date of Patent: Sep. 28, 1999

[54] SYNCHRONOUS SEMICONDUCTOR MEMORY HAVING A REDUCED NUMBER OF REGISTERS

[75] Inventor: Yasushi Matsubara, Tokyo, Japan

[73] Assignee: NEC Corporation, Tokyo, Japan

[21] Appl. No.: 08/907,946

[22] Filed: Aug. 11, 1997

[30] Foreign Application Priority Data

Aug. 9, 1996 [JP] Japan ................................ 8-227778

[51] Int. Cl.[6] .................................................. G11C 7/00
[52] U.S. Cl. .............................. 365/189.05; 365/189.12; 365/233
[58] Field of Search ....................... 365/189.05, 189.12, 365/221, 233

[56] References Cited

U.S. PATENT DOCUMENTS

| | | | |
|---|---|---|---|
| 4,800,530 | 1/1989 | Itoh et al. ........................... | 365/189.12 |
| 5,204,841 | 4/1993 | Chappel et al. .................... | 365/189.12 |
| 5,440,515 | 8/1995 | Chang et al. ....................... | 365/189.12 |
| 5,530,670 | 6/1996 | Matsumoto .......................... | 365/189.12 |
| 5,566,124 | 10/1996 | Fudeyasu et al. .................. | 365/189.12 |
| 5,608,674 | 3/1997 | Yabe et al. .......................... | 365/189.05 |

*Primary Examiner*—Son T. Dinh
*Attorney, Agent, or Firm*—Foley & Lardner

[57] ABSTRACT

In a synchronous DRAM including a register having an input gate and an output gate, for holding read-out data between the input gate and the output gate by opening the input gate, and for transferring or outputting the held data by opening the output gate. An input gate control circuit for controlling an open/close of the input gate is supplied with a output switch feedback signal in the form of a one-shot pulse generated by an output gate control circuit for controlling an open/close of the output gate, in synchronism with an output gate switch signal, so that only after the data held in the register has been outputted to an external of the register, the next data to be succeedingly transferred from the read/write bus to the register is actually latched in the register.

10 Claims, 14 Drawing Sheets

SYNCHRONOUS SEMICONDUCTOR MEMORY HAVING A REDUCED NUMBER OF REGISTERS

BACKGROUND OF THE INVENTION

1. Field of the Invention

The present invention relates to a synchronous semiconductor memory, and more specifically to a synchronous dynamic random access memory having a reduced number of registers.

2. Description of Related Art

At present, an increase of an operation speed of microprocessors is remarkable, and an operation frequency reaches more than 100 MHz. Development for obtaining a memory which can operate under the operation frequency of the microprocessor, is actively being conducted.

Among memories operating at a high speed, a synchronous dynamic random access memory (abbreviated to a "synchronous DRAM") is particularly sought from a market with the strongest demand. In brief, the synchronous DRAM has a clock input terminal for receiving an external clock, and is configured to latch a command such as a reading command and a writing command in synchronism with a rising of the clock pulse supplied to the clock input terminal, and to output a read-out data or to receive data to be written.

Referring to FIG. 1, there is shown a block diagram of illustrating a whole construction of the conventional synchronous DRAM, which is constructed in accordance with a so called "output latching method".

The shown synchronous DRAM comprises a command buffer 101 receiving a plurality of command signals 22-1 to 22-m, a clock buffer 103 receiving an external clock signal 23, and an address buffer 104 receiving a plurality of address signals 21-1 to 21-n. The clock buffer 103 generates an internal reference clock 25 in synchronism with the external clock signal 23.

The internal reference clock 25 is supplied to the command buffer 101, the address buffer 104, and a burst control circuit 105. At a so called "high edge" timing of the internal reference clock 25 where the internal reference clock 25 changes from a low level to a high level, the command buffer 102 latches and outputs a plurality of internal command signals 26-1 to 26-m corresponding to the command signals 22-1 to 22-m, and the address buffer 104 latches and outputs a plurality of internal address signals 24-1 to 24-n corresponding to the address signals 21-1 to 22-n. Therefore, it can be deemed that, at the timing the clock signal 23 changes from a low level to a high level, the command signals 22-1 to 22-m and the address signals 21-1 to 21-n are fetched into the command buffer 101 and the address buffer 104, respectively.

A command decoder 102 receives and decodes the internal command signals 26-1 to 26-m, to output various internal commands including a read command 27, a write command 227, an activation command 228, a precharge command 229, etc. which cause to start various functions including a reading, a writing, an activation, a precharging, etc. In the following, only parts relating to only the reading operation will be described.

The read command 27 is supplied to the burst control circuit 105, which generates various control signals in response to the read command 27 and in synchronism with the internal reference clock 25.

Here, the "burst" or "burst mode" is one of various features characterizing the synchronous DRAM. In a conventional dynamic random access memory (DRAM), in response to a reading address supplied from an external, data stored at the reading address is read out, so that one data is outputted in response to one address inputting. In the synchronous DRAM, on the other hand, when one address is supplied from an external, a series of internal addresses starting from the address supplied from the external, are sequentially and regularly generated in the inside of the synchronous DRAM chip, in synchronism to a series of clock signals such as the external clocks 23, so that data items stored at the internally generated addresses are continuously read out in synchronism with the clock signal.

The above mentioned operation of reading out a plurality of continuous data items in synchronism with the clock signal, is called a "burst" operation, and the length of the data train which can be read out and outputted by designating one address, is called a "burst length". In general, the burst length includes 2, 4 and 8, in which, for each one read command, data of two bits, or four bits, or eight bits are read out and outputted through each one input/output pin in synchronism with the clock signal, respectively.

Returning to FIG. 1, the burst control circuit 105 has the purpose of repeating the reading operation by the bit number of the burst length. For this purpose, the burst control circuit 105 drives a column decoder 107, a data amplifier 110 and an input gate control circuit 111 by activation signals 235, 236 and 210, respectively, which are generated in synchronism with the internal reference clock 25.

Selection and reading-out of data from a memory cell array 106 are similar to those performed in the conventional DRAM. In brief, a row decoder 108 associated to the memory cell array 106, decodes a row address composed of row address signals 29-1 to 29-q and selects a word line before the reading operation starts. Data of memory cells connected to all gates connected to the selected word line are supplied to a sense amplifier block 109 associated to the memory cell array 106, and are retained in the sense amplifier block 109.

One sense amplifier is selected from the sense amplifier block 109 by the column decoder 107 associated to the memory cell array 106 and receiving and decoding a column address composed of the column address signals 24-1 to 24-n. Thus, the read-out data is supplied from the selected sense amplifier through a pair of read-out lines 211 and 212 to the data amplifier 110.

A construction and operation succeeding to the above mentioned construction and operation are a characterized portion of the synchronous DRAM. The data amplifier 110 further amplifies the data on the read-out lines 211 and 212, and transfers the amplified data through a pair of read/write bus lines 213 and 214 to a first input gate 113 and a second input gate 115.

Here, in response to the activation signal 210 outputted from the burst control circuit 105 at substantially the same timing as the activation signals 235 and 236, the input gate control circuit 111 is brought into a standby condition. In this standby condition, the input gate control circuit 111 outputs a first input gate switch signal 222 in response to a data output signal 215 which is transferred from the data amplifier 110 at substantially the same timing as the data signals are transferred through the read/write bus lines 213 and 214 to the first input gate 113 and the second input gate 115, respectively. This first input gate switch signal 222 is supplied to the first input gate 113, and is in the form of a one-shot pulse, so that, only during a period in which the first input gate switch signal 222 in the form of the one-shot pulse is active, the first input gate 113 is opened, namely, rendered conductive. As a result, the first item of data in the burst transferred through the read/write bus lines 213 and 214 is latched in a first register 240, and is held in output lines 216 and 217 of the first input gate 113.

After the above mentioned operation, in response to a next clock signal 23, a second item of data in the burst is transferred to the read/write bus lines 213 and 214, and it then latched in a second register 241, similarly to the above mentioned operation.

Here, a "latency" characterized in the reading operation of the synchronous DRAM will be described. Assuming that a cycle (or period) of the clock signal 23 is called a "clock cycle", if a time length starting from a "high edge" of the clock signal 23 where the read command is fetched and terminating when the first data is latched in the first register 240, is substantially equal to the clock cycle, it is said that the synchronous DRAM is used as being a synchronous DRAM of the latency 2.

In the latency 3, two times the clock cycle is required until the first data is latched in the first register 240. In the latency 4, three times the clock cycle is required until the first data is latched in the first register 240. From these relations it would be seen that the smaller (or shorter) the clock cycle is, the larger the latency becomes.

In the case of the latency 2, assuming that the clock signal 23 for fetching the read command is a first clock and the clock signal supplied next to the clock signal 23 for fetching the read command is a second clock, the read-out data is outputted in response to the second clock. This means that a time of one cycle is required until the data is latched and it has become ready to output the data.

The latency control of this latency 2 will be described with reference to FIG. 1, again.

A latency control circuit 117 receives the internal reference clock 25 and the read command 27, and generates an output enable signal 224 in synchronism with the high edge of the second internal reference clock 25.

In response to the output enable signal 224 and in synchronism with the internal reference clock 25, an output gate control circuit 112 generates a first output gate switch signal 223 in the form of a one-shot pulse, to a first output gate 114. During an active period of the first output gate switch signal 223 in the form of the one-shot pulse, the data latched in the first register 240 is transferred to a pair of read bus lines 218 and 219, and latched on the read bus lines 218 and 219 at the termination of the one-shot pulse of the first output gate switch signal 223. The latched data is outputted through an output buffer 118 to an external input/output pin 230.

Similarly, the data latched in the second register 241 is transferred through a second output gate 116 which is opened or rendered conductive by a second output gate switch signal 234 in the form of a one-shot pulse generated in synchronism with the internal reference clock 25, alternately with the first output gate switch signal 223. Thus, the data latched in the second register 241 is outputted through the output buffer 118 to the external input/output pin 230.

Referring to FIG. 2, there is shown a timing chart illustrating how the data of the two registers 240 and 241 is alternately transferred and outputted. In FIG. 2, Reference Numerals given to various signal waveforms correspond to nodes given with the same Reference Numerals in FIG. 1, and although the explanation of the operation has been already made, the explanation will be made again but now with reference to FIG. 2.

Namely, in synchronism with a rising of the one-shot pulse of the first gate switch signal 222 from the input gate control circuit 111, the "DATA 1" is transferred through the first input gate 113 to the output lines 216 and 217 of the first input gate 113. At a falling edge of the one-shot pulse of the first output gate switch signal 223 from the output gate control circuit 112, the "DATA 1" on the output lines 216 and 217 of the first input gate 113 is transferred through the first output gate 114 to the read bus lines 218 and 219. On the other hand, in synchronism with a rising of the one-shot pulse of the second input gate switch signal 233 from the input gate control circuit 111, the "DATA 2" is transferred through the second input gate 115 to the output lines 231 and 232 of the first input gate 115. At a falling edge of the one-shot pulse of the second output gate switch signal 234 from the output gate control circuit 112, the "DATA 2" on the output lines 231 and 232 of the second input gate 115 is transferred through the second output gate 116 to the read bus lines 218 and 219. Thereafter, "DATA 3" and succeeding data are outputted in a similar manner until the output data reaches the burst length.

Now, why the first and second registers 240 and 241 are required in synchronous DRAM shown in FIG. 1, namely, why two registers are required in the case of the latency 2 in the conventional synchronous DRAM, will be explained with reference to FIG. 3.

In FIG. 3, considering a flow of an internal data transfer within the synchronous DRAM, when the internal data transfer flow is divided into two stages, namely, a former stage and a later stage, by using as a boundary an input gate of the registers 240 and 241, the former stage is called a "stage 1". In addition, a "stage 2-1" means the first register 240, and a "stage 2-2" means the second register 241. A "stage 3" correspond to the read bus lines pair 218 and 219.

Now, a "first data transfer time" is a time from the moment the reading operation starts in response to the internal reference clock 25 to the moment the read-out data reaches to the register. This first data transfer time is independent of the clock cycle, namely, is asynchronous to the clock. A "second data transfer time" requires the same time as the "first data transfer time".

In the "stage 2-1", there is a "first data waiting time" which corresponding to the "first data transfer time" and in which no operation occurs. Furthermore, a latching time (from a timing 4-2 to a timing 4-3) is required in which the data is supplied to the first register 240 and latched in the first register 240. Succeedingly, an outputting time (from the timing 4-3 to a timing 4-4) is required in which the data is outputted to the "stage 3". At this time, just before, or around, or just after a starting (timing 4-3) of the outputting time of the "stage 2-1", the "stage 1" receives the internal reference clock 25 so that the "second data transfer time" starts.

As mentioned above, since the "second data transfer time" has a constant time length, a time 4-6 where the latching starts in the stage 2-2, is determined by a constant time length from the high edge of the internal reference clock 25. However, the first data outputting time starting from the time 4-3 and terminating at the time 4-4, is dependent upon the clock cycle. Therefore, it is so designed that the data is outputted at an intermediate timing between (respective high edges of) second and third clock signals 23.

Therefore, the outputting time of the stage 2-1 and the input time of the stage 3 are shifted forward in time if the clock cycle is short, and shifted backward in time if the clock cycle is long.

As seen from the above, if the clock cycle becomes long and exceeds a certain value, the outputting time in the stage 2-1 and the second data latching time in the stage 2-2 overlap in time. Therefore, if only one register was prepared, data collision occurs.

In order to prevent this data collision, two registers are provided as shown in FIG. 1.

Referring to FIG. 4, there is shown a circuit diagram of the two registers 240 and 241 incorporated in the synchronous DRAM shown in FIG. 1.

In the circuit shown in FIG. 4, first and second registers 830 and 831 correspond to the registers 240 and 241 incorporated in the synchronous DRAM shown in FIG. 1, respectively. Therefore, a circuit scale of the registers shown in FIG. 4 could be imagined.

In the circuit shown in FIG. 4, furthermore, lines 85 and 86 correspond to the pair of read/write bus lines 213 and 214, respectively. Therefore, an inverter formed of a PMOS transistor Q801 and an NMOS transistor Q802 and another inverter formed of a PMOS transistor Q803 and an NMOS transistor Q804 can be considered to constitute a final stage of the data amplifier 110.

A signal line 87 corresponds to the first input gate switch signal 222, and therefore, a pair of transfer gates 850 and 851 (included in the first register 830) connected to the lines 85 and 86, respectively, and controlled by the signal line 87, constitute the first input gate 113. A signal line 814 corresponds to the second input gate switch signal 233, and therefore, a pair of transfer gates 852 and 853 (included in the second register 831) connected to the lines 85 and 86, respectively, and controlled by the signal line 814, constitute the second input gate 115.

A pair of lines 812 and 813 correspond to the lines 216 and 217 in the first register 240 shown in FIG. 1, respectively, and a pair of lines 815 and 816 correspond to the lines 231 and 232 in the second register 241 shown in FIG. 1, respectively. A pair of lines 820 and 821 correspond to the pair of read bus lines 218 and 219 shown in FIG. 1, and a terminal 811 corresponds to the external input/output pin 230. In addition, a signal lines 839 corresponds to the output enable signal 224 shown in FIG. 1, and therefore, the output buffer 118 is constituted of a NAND gate 840 having two inputs connected to the lines 820 and 839, a NOR gate 841 having a first input connected to the line 821 and a second input connected through an inverter 842 to the line 839, and an inverter formed of a PMOS transistor Q805 having a gate connected to an output of the NAND gate 840 and a drain connected to the output terminal 811 and an NMOS transistor Q806 having a gate connected to an output of the NOR gate 841 and a drain connected to the output terminal 811.

A signal line 810 corresponds to the first output gate switch signal 223, and therefore, a pair of transfer gates 854 and 855 (included in the first register 830) connected to the lines 820 and 821, respectively, and controlled by the signal line 810, constitute the first output gate 114. A signal line 819 corresponds to the second output gate switch signal 234, and therefore, a pair of transfer gates 856 and 857 (included in the second register 831) connected to the lines 820 and 821, respectively, and controlled by the signal line 819, constitute the second output gate 116.

Furthermore, Reference Numerals 832, 833, 834, 835, 836 and 837 designate flipflop circuits each inserted into or connected to a corresponding line 812, 813, 815, 816, 820 and 821, for positively holding data on the corresponding line, and Reference Numerals Q81, Q82, Q83, Q84, Q85 and Q86 show reset switches associated with the flipflop circuits 832, 833, 834, 835, 836 and 837, respectively. These reset switches Q81, Q82, Q83, Q84, Q85 and Q86 are connected to receive reset control signals 88, 89, 817, 818, 817 and 818, respectively, which are activated for the purpose of resetting data on the line connected with the corresponding reset switch when the operation is changed from the reading operation to the writing operation.

As mentioned above, in the conventional synchronous DRAM, the first register 240 or 830 and the second register 241 or 831, namely, two registers are required for each one external input/output pin 230 or 811. Therefore, in the synchronous DRAM of ×4, eight registers are required, and in the synchronous DRAM of ×8, 16 registers are required. Furthermore, in the synchronous DRAM of ×16, 32 registers are required, and the synchronous DRAM of ×32, 64 registers are required.

A recent market is requiring a product having a large bit number, such as a product of ×16 and a product of ×32. As mentioned above with reference to FIG. 4, the register circuit itself is not so large in circuit scale, however, if 32 registers or 64 registers are required, it results in an increased chip area of the synchronous DRAM.

As a result, the conventional synchronous DRAM has the chip area larger than that of the conventional DRAM by about 10%, and the increase of the chip area also results in an increased cost. At present, since reduction of the cost will increase the demand for product, and a maker can ensure and increase profits. Therefore, a target of developers is to make the manufacturing cost as small as possible.

SUMMARY OF THE INVENTION

Accordingly, it is an object of the present invention to provide a synchronous DRAM which has overcome the above mentioned defect of the conventional one.

Another object of the present invention is to provide a synchronous DRAM having a minimum number of registers for temporarily holding data in synchronism with a clock.

The above and other objects of the present invention are achieved in accordance with the present invention by a synchronous semiconductor memory so constructed that data is transferred from a data amplifier connected to a sense amplifier connected a memory cell array, through a read/write bus to a register, and then, is transferred to a final output buffer after a predetermined required time so that a first data and a second data are continuously outputted to an external, the synchronous semiconductor memory comprising only one register for receiving and holding the data transferred through said read/write bus from said data amplifier, and means receiving a one-clock-preceding internal clock just before an internal clock giving a reference for outputting said second data from the synchronous semiconductor memory to said external, a first signal indicating that said second data has reached to said register, and a second signal meaning that said first data has been outputted from said register, as an input condition for allowing said second data transferred to said register at a place next to said first data, to be actually latched into said register which holds said first data, said means generating an input control signal to said register when all of said one-clock-preceding internal clock input, said first signal and said second signal are received, so that said second data is actually latched into said register.

The above and other objects, features and advantages of the present invention will be apparent from the following description of preferred embodiments of the invention with reference to the accompanying drawings.

DESCRIPTION OF THE PREFERRED EMBODIMENTS

Figure 5:
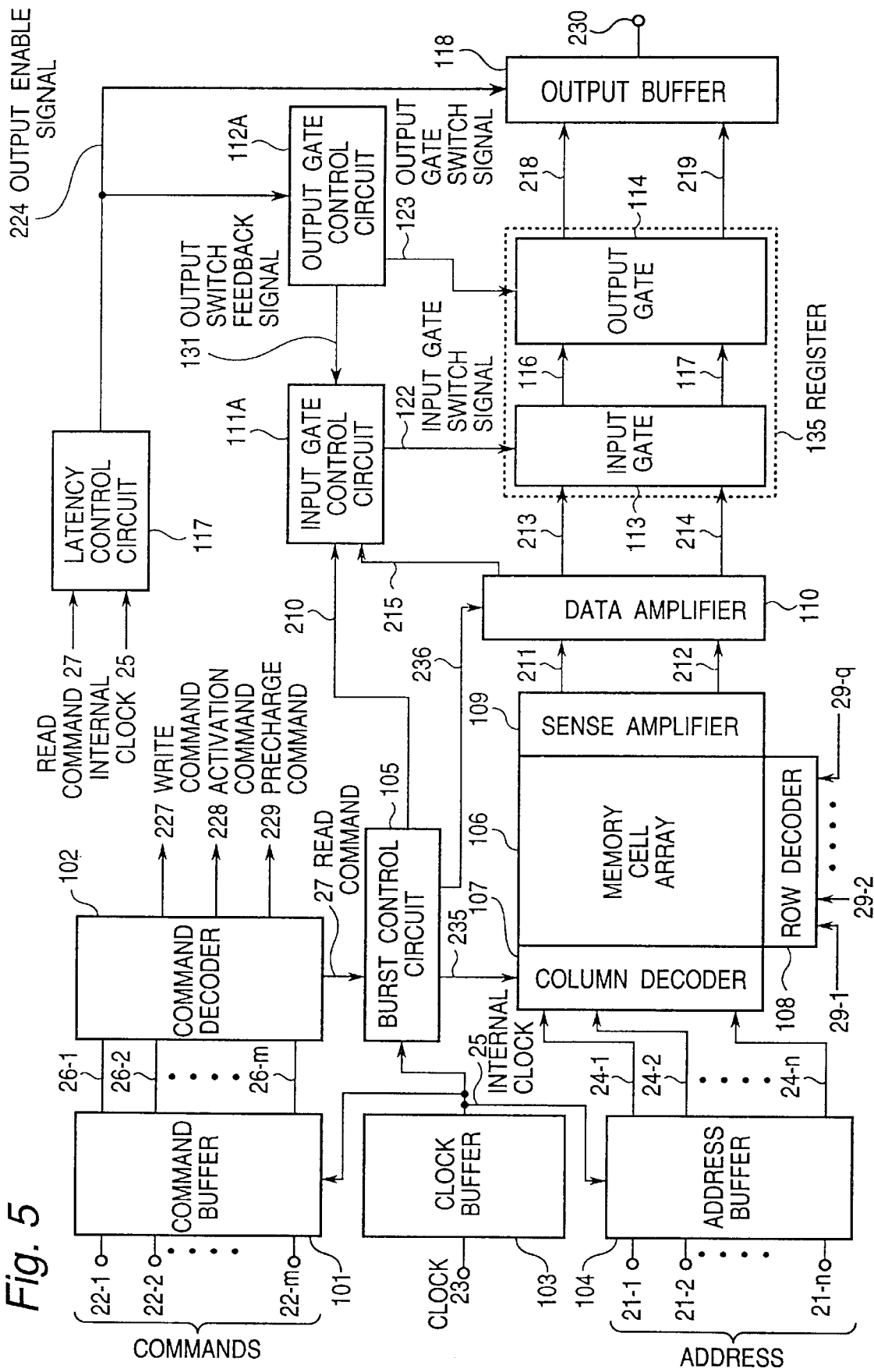
FIG. 5 is a block diagram of illustrating a whole construction of a first embodiment of the synchronous DRAM in accordance with the present invention.

Referring to FIG. 5, there is shown a block diagram of illustrating a whole construction of a first embodiment of the synchronous DRAM in accordance with the present invention. In FIG. 5, elements similar or corresponding to those shown in FIG. 1 are given the same Reference Numerals, and explanation thereof will be omitted for simplification of description.

Figure 1:
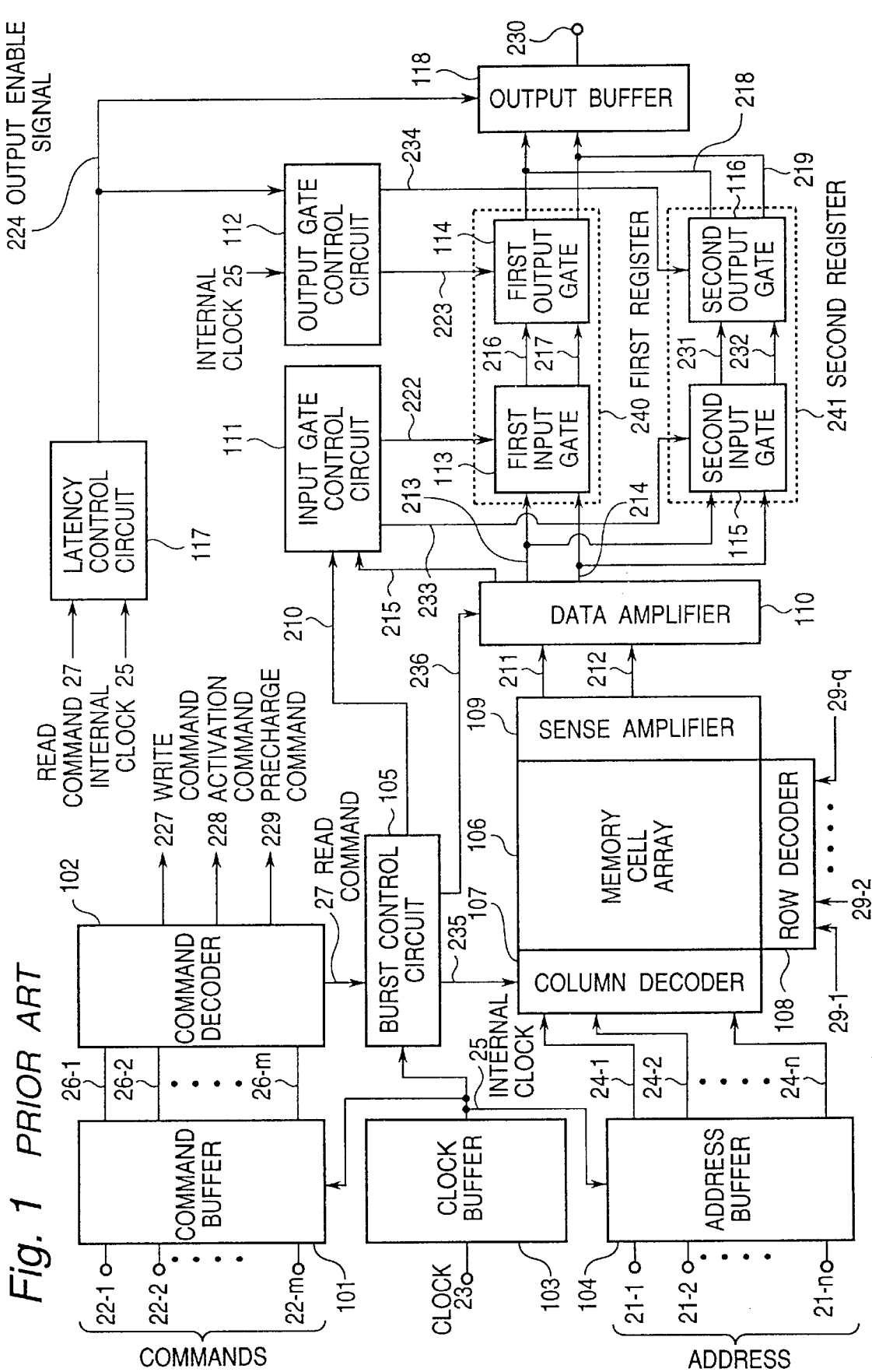
FIG. 1 is a block diagram of illustrating a whole construction of the conventional synchronous DRAM.
Figure 2:
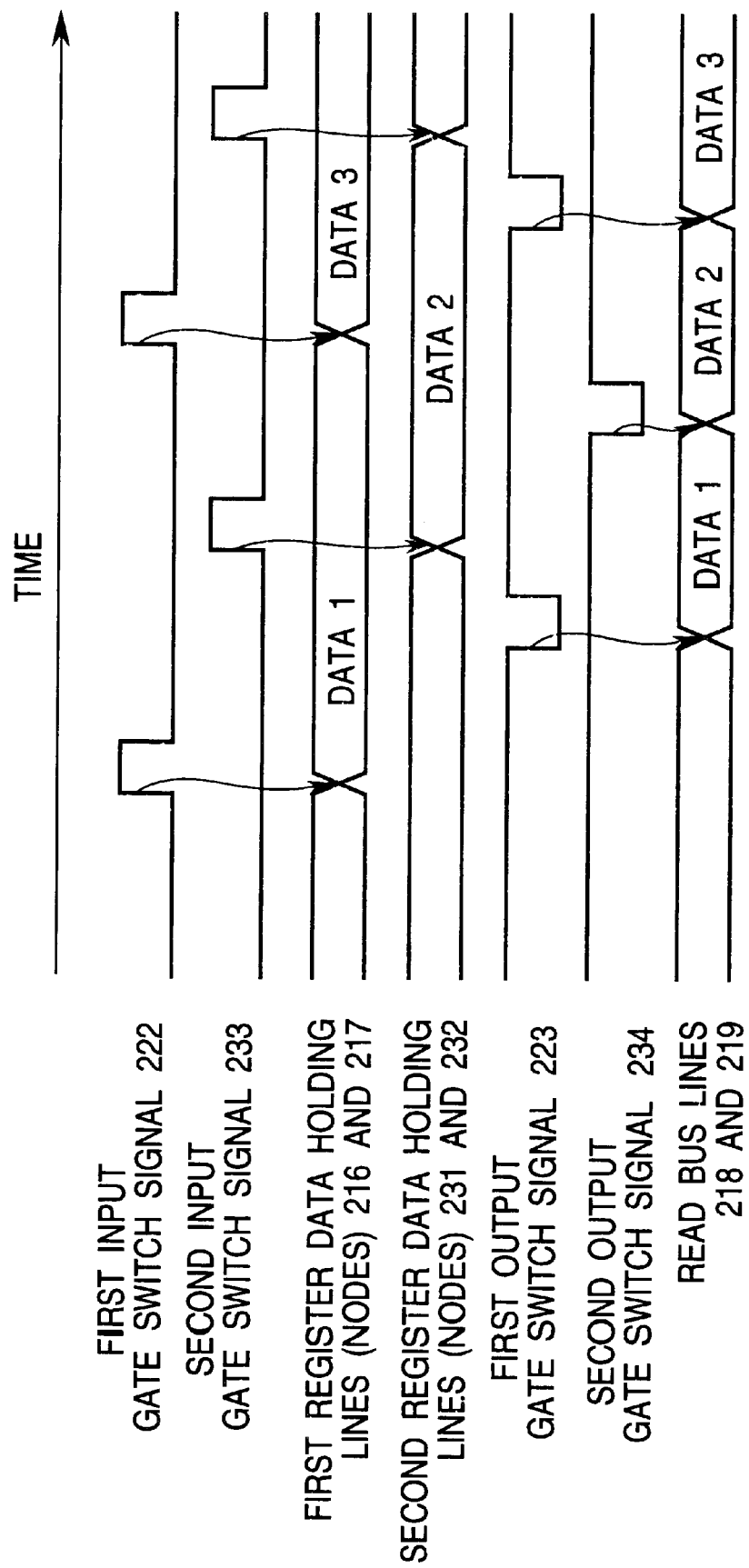
FIG. 2 is a timing chart illustrating how the data of the two registers is alternately transferred and outputted in the conventional synchronous DRAM shown in FIG. 1.

As seen from comparison between FIGS. 1 and 5, the first embodiment shown in FIG. 5 is different from the conventional synchronous DRAM shown in FIG. 1, in which, for the purpose of reducing the number of registers which was required to be equal to the number of the latency in the conventional synchronous DRAM, an input gate control circuit designated with Reference Numeral 111A in place of Reference Numeral 111 is configured to receive an output switch feedback signal 131 generated in an output gate control circuit designated with Reference Numeral 112A in place of Reference Numeral 112, and in addition, for each one data input/output pint, only one register 135 is provided in place of the two registers 240 and 241 in the conventional synchronous DRAM shown in FIG. 1. Therefore, the input gate control circuit 111A controls only an input gate 113 of the register 135, and the output gate control circuit 112A controls only the output gate 114 of the register 135.

Figure 4:
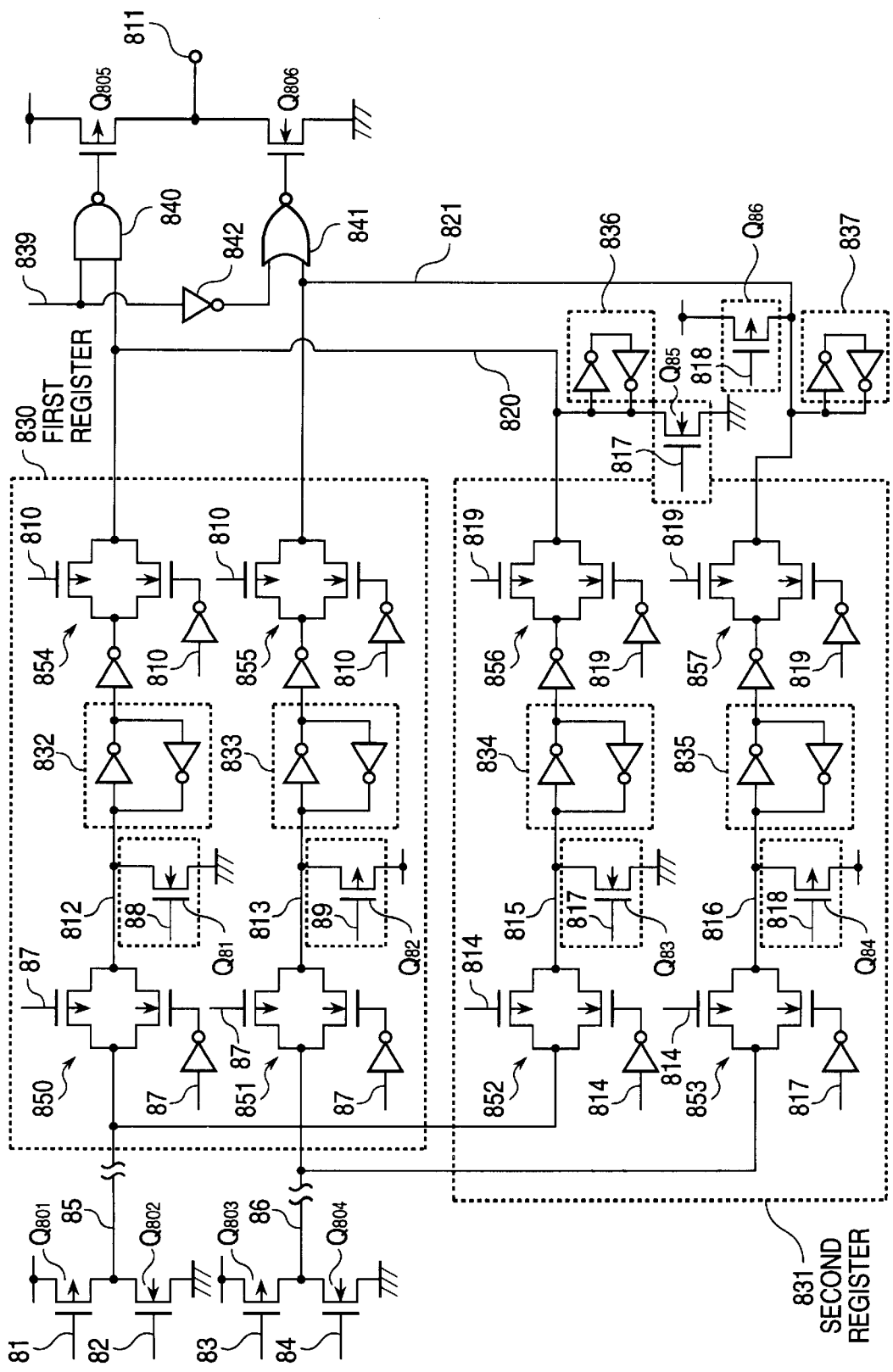
FIG. 4 is a circuit diagram of the two registers incorporated in the synchronous DRAM shown in FIG. 1.
Figure 6:
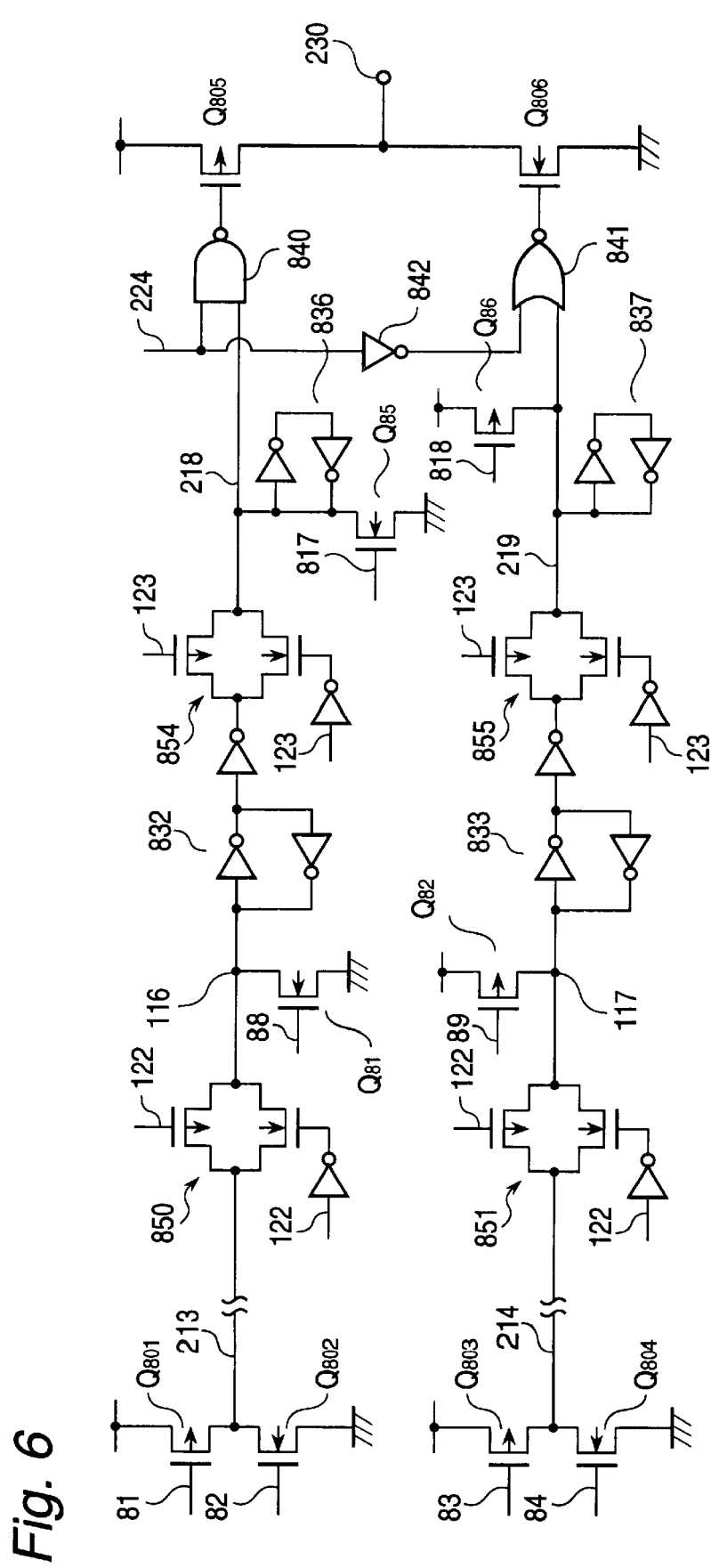
FIG. 6 is a circuit diagram of the register incorporated in the embodiment of the synchronous DRAM shown in FIG. 5.

Referring to FIG. 6, there is shown a circuit diagram of the register 135 incorporated in the embodiment of the synchronous DRAM shown in FIG. 5. In FIG. 6, signals corresponding to those shown in FIG. 5 are given the same Reference Numerals, and signals and elements corresponding to those shown in FIG. 4 are also given the same Reference Numerals. As seen from comparison between FIGS. 4 and 6, since the circuit shown in FIG. 6 corresponds to one obtained by removing the second register 831 from the circuit shown in FIG. 4, explanation of the construction and the operation of the circuit shown in FIG. 6 will be omitted.

Here, since the function of the output switch feedback signal 131 constitutes an essential feature of the first embodiment, and since the operation of the other elements has been already explained in connection with the conventional synchronous DRAM shown in FIG. 1, the function of the output switch feedback signal 131 will be described with reference to FIG. 7, which is a timing chart illustrating an operation of the synchronous DRAM shown in FIG. 5.

At a "low edge" timing where the data amplifier activation signal 236 from the burst control circuit 104 is brought to a low level, the data signal "DATA 1" amplified in the data amplifier 110 is transferred to the pair of read/write bus lines 213 and 214.

Thereafter, an input gate switch signal 122 in the form of a positive one-shot pulse is outputted from the input gate control circuit 111A to the input gate 113, so that during a period in which the input gate switch signal 122 is active, the "DATA 1" is transferred to data holding lines or nodes 116 and 117 of the register 135, and latched on the data holding nodes 116 and 117 of the register 135 when the input gate switch signal 122 becomes inactive, namely, when the input gate 113 is closed.

At this time, the read/write bus line pair 213 and 214 is precharged in response to the low edge of the input gate switch signal 122 in the form of the one-shot pulse.

Furthermore, an output gate switch signal 123 in the form of a negative one-shot pulse is outputted from the output gate control circuit 112A to the output gate 114, so that during a period in which the output gate switch signal 123 is active, the "DATA 1" latched on the data holding nodes 116 and 117 of the register 135 is transferred to a pair of read bus lines 218 and 219 connected to the output buffer 118. At this time, the output switch feedback signal 131 in the form of a negative one-shot pulse having the same pulse width as that of the output gate switch signal 123, is outputted from the output gate control circuit 112A to the input gate control circuit 111A, at substantially the same timing as the outputting of the output gate switch signal 123.

At a "high edge" timing of the output switch feedback signal 131 where the output switch feedback signal 131 is brought or returned to a high level, the input gate control circuit 111A generates the input gate switch signal 122 in the form of a one-shot pulse to the input gate 113, to cause the "DATA 2" to be latched in the register 135.

This operation can be said to means that the next data "DATA 2" is latched after completion of the open-and-then-close operation of the output gate 114. In addition, in order to prevent the next data "DATA 2" from disappearing from the read/write bus line pair 213 and 214 before the next data "DATA 2" is latched on the data holding nodes 116 and 117 of the register 135, the next data "DATA 2" is held on the read/write bus line pair 213 and 214 until the low edge of the input gate switch signal 122.

In the above mentioned manner, succeeding "DATA 3" and "DATA 4" are sequentially latched in the register 135 and then outputted to the output buffer 118.

Figure 8:
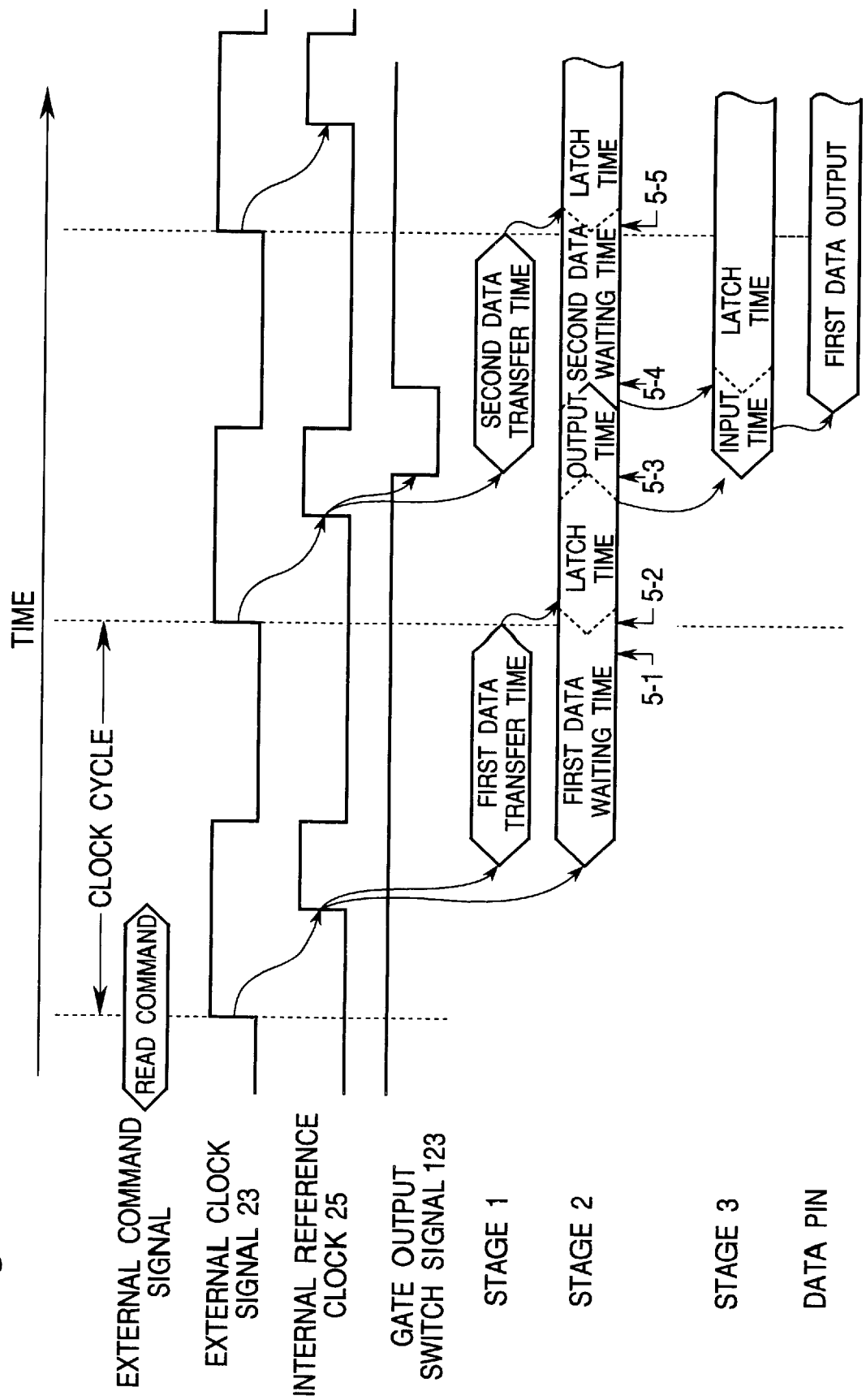
FIG. 8 is a timing chart illustrating a register control method performed in the first embodiment of the synchronous DRAM shown in FIG. 5.

Hereinbefore, it has been described with reference to FIG. 3 that in the case of the latency 2, the conventional synchronous DRAM requires two registers for each one bit. Now, referring to FIG. 8 which is a waveform diagram similar to that of FIG. 3 but illustrates that in the shown embodiment of the synchronous DRAM, it is sufficient if only one register is provided for each one bit in the case of the latency 2. In FIG. 8, similarly to the example shown in FIG. 3, a "stage 1" corresponds to a portion before the register 135, and a "stage 2-1" corresponds to the register 135. A "stage 3" corresponds to the read bus lines pair 218 and 219.

Figure 3:
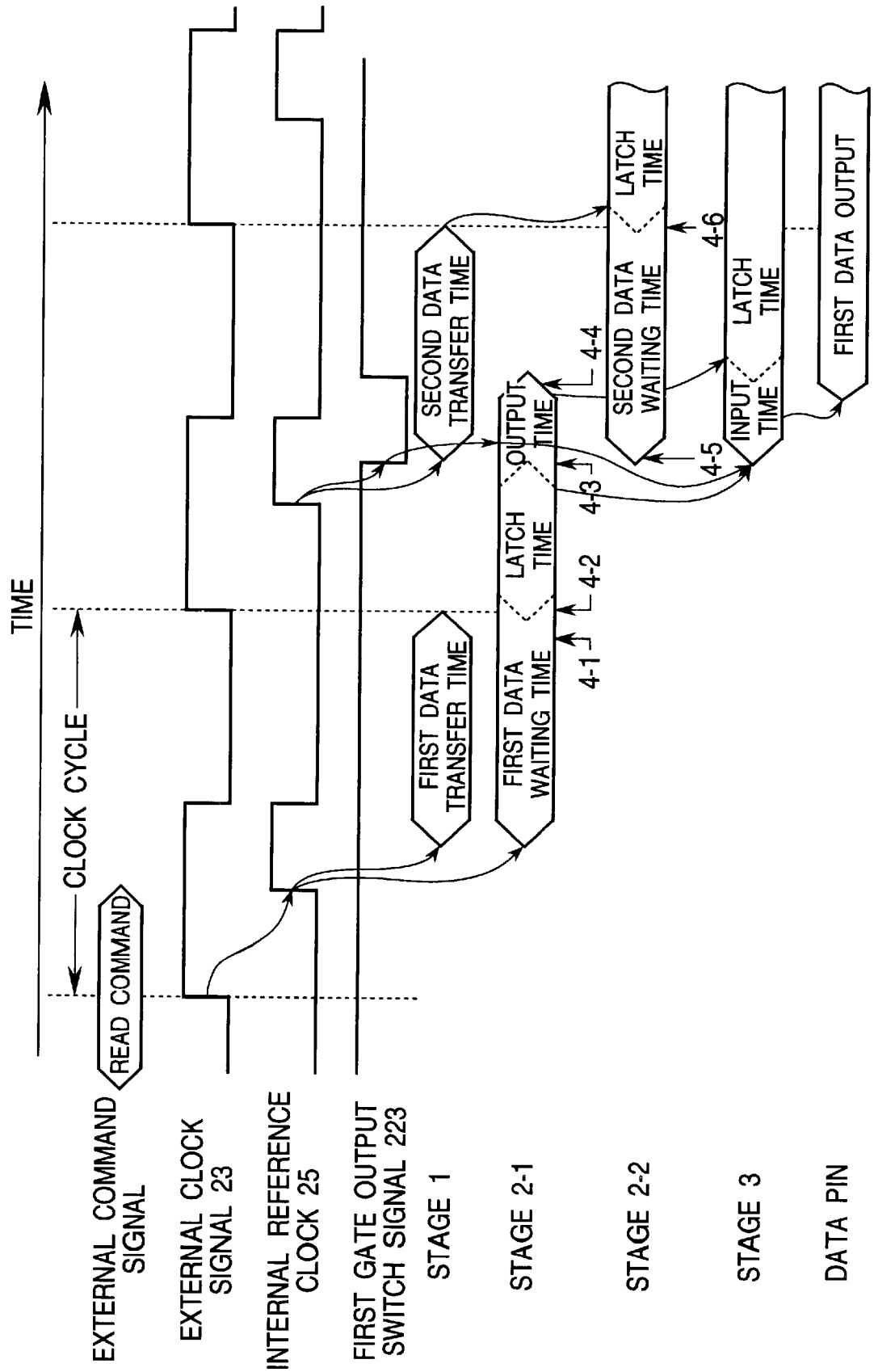
FIG. 3 is a timing chart illustrating why two registers are required in the case of the latency 2 in the conventional synchronous DRAM shown in FIG. 1.

First, similarly to the example shown in FIG. 3, the first data is latched in the stage 2 (register 135) at a time 5-2, and maintained during a period from the time 5-2 until a time 5-3. The first data latched in the register 135 is transferred to the stage 3 during a period from the time 5-3 until a time 5-4, and thereafter, the second stage goes into a second data waiting time (starting from the time 5-4 and terminating at a timing 5-5). After the second data waiting time has elapsed, namely, at the time 5-5, the second data is latched in the stage 2 (register 135).

Figure 7:
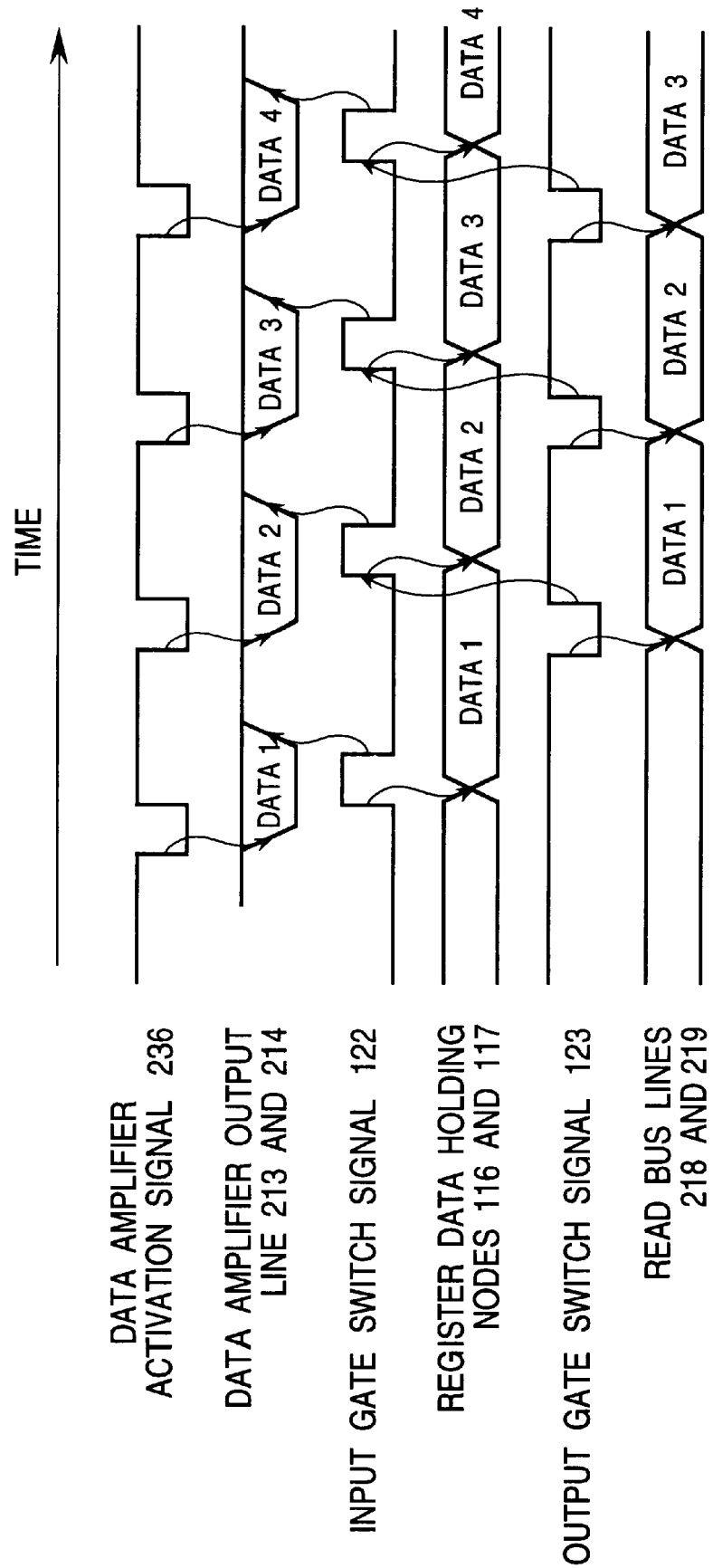
FIG. 7 is a timing chart illustrating an operation of the synchronous DRAM shown in FIG. 5.

Here, in the timing chart shown in FIG. 7, just after the first data (DATA 1) is outputted from the register 135, the second data (DATA 2) is latched in the register. However, differently from the timing chart shown in FIG. 7, in the timing chart shown in FIG. 8, the second data is not latched in the register just after the first data is outputted from the register 135. The reason for this is that the clock cycle shown in shown in FIG. 8 is shorter than the clock cycle shown in shown in FIG. 7.

If the clock cycle shown in shown in FIG. 8 becomes long, the outputting time relatively approaches the second data latching time, namely, the timing 5-5. In the shown embodiment, however, since the relation that the timing 5-5 is later than the timing 5-4 is maintained and since the second data is maintained in the stage 1 until the register becomes ready to latch the second data, the synchronous DRAM having the latency 2 can be constituted with only one register for each one bit.

As mentioned above, the shown embodiment is characterized in such a control manner that, the output gate control circuit 112A generates the output switch feedback signal 131 in synchronism with the output gate switch signal 123, and the input gate control circuit 111A generates the input gate switch signal 122 after the input gate control circuit 111A receives the output switch feedback signal 131, and on the other hand, in order to ensure that the next data exists on the read/write bus line pair until the input gate switch signal 122 is generated, the next data is held on the read/write bus line pair just before the register until the next data is latched in the register in response to the input gate switch signal 122. Thus, in the case of the latency 2, the necessary number of registers can be reduced by one for each one bit.

Figure 9:
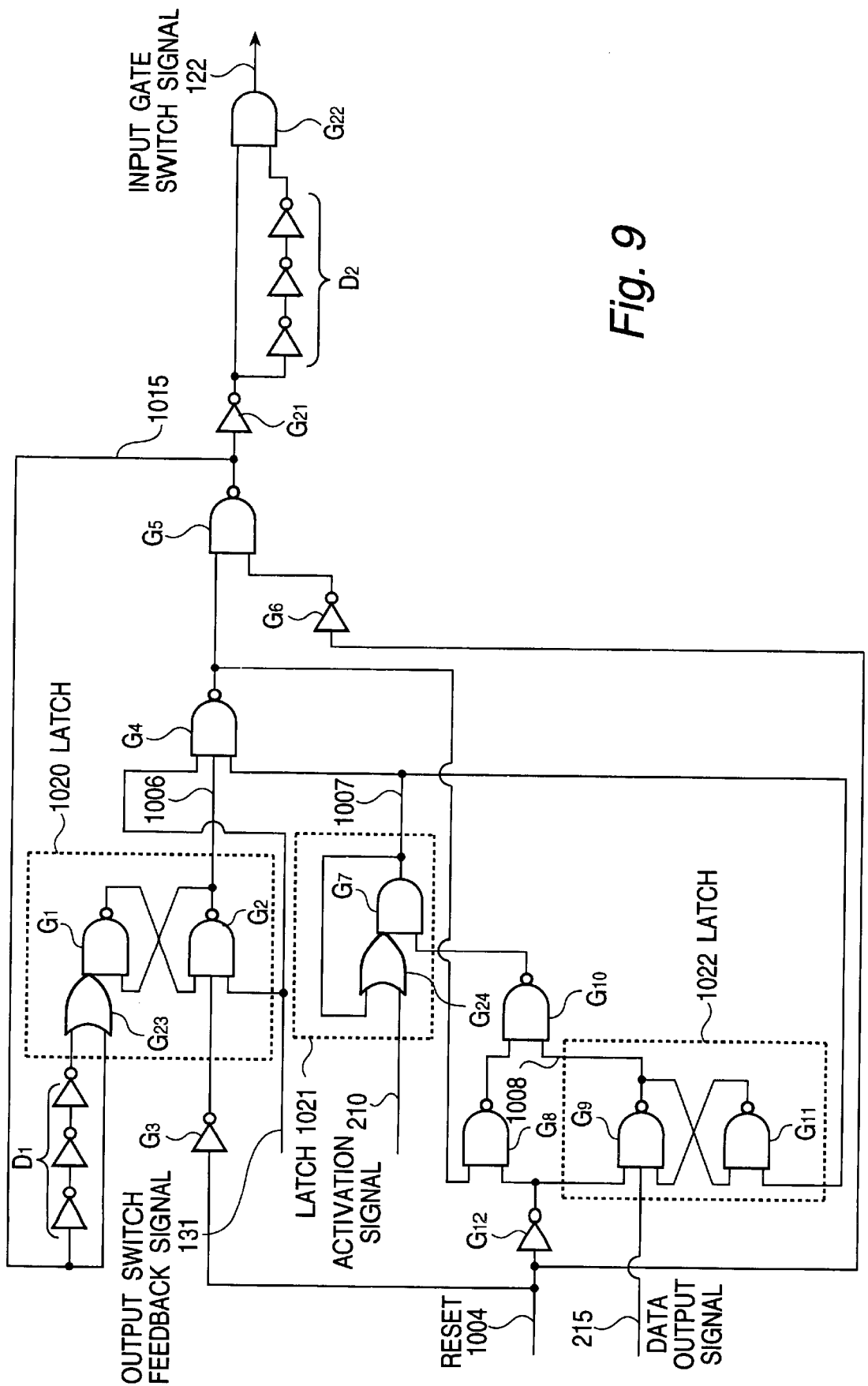
FIG. 9 is a circuit diagram of an example of the input gate control circuit incorporated in the embodiment of the synchronous DRAM in accordance with the present invention.

Referring to FIG. 9, there is shown a circuit diagram of an example of the input gate control circuit 111A incorporated in the embodiment of the synchronous DRAM in accordance with the present invention. In FIG. 9, signals corresponding to those shown in FIG. 5 are given the same Reference Numerals. Reference Numeral 1004 designates a signal for resetting (or setting) the input gate control circuit 111A, although the reset signal 1004 is not shown in FIG. 5.

As shown in FIG. 9, the input gate control circuit 111A comprises three latches 1020, 1021 and 1022, inverters G3, G6, G12 and G21, NAND gates G4, G5, G8 and G10, an AND gate G22, and delay circuits D1 and D2, which are connected as shown. The latch 1020 is composed of NAND gates G1 and G2 and an OR gate G23 connected as shown. The latch 1021 is composed of an AND gate G7 and an OR gate G24 connected as shown. The latch 1022 is composed of NAND gates G9 and G11 connected as shown. Each of the delay circuits D1 and D2 is composed of an odd number of three or more cascaded inverters.

Figure 10:
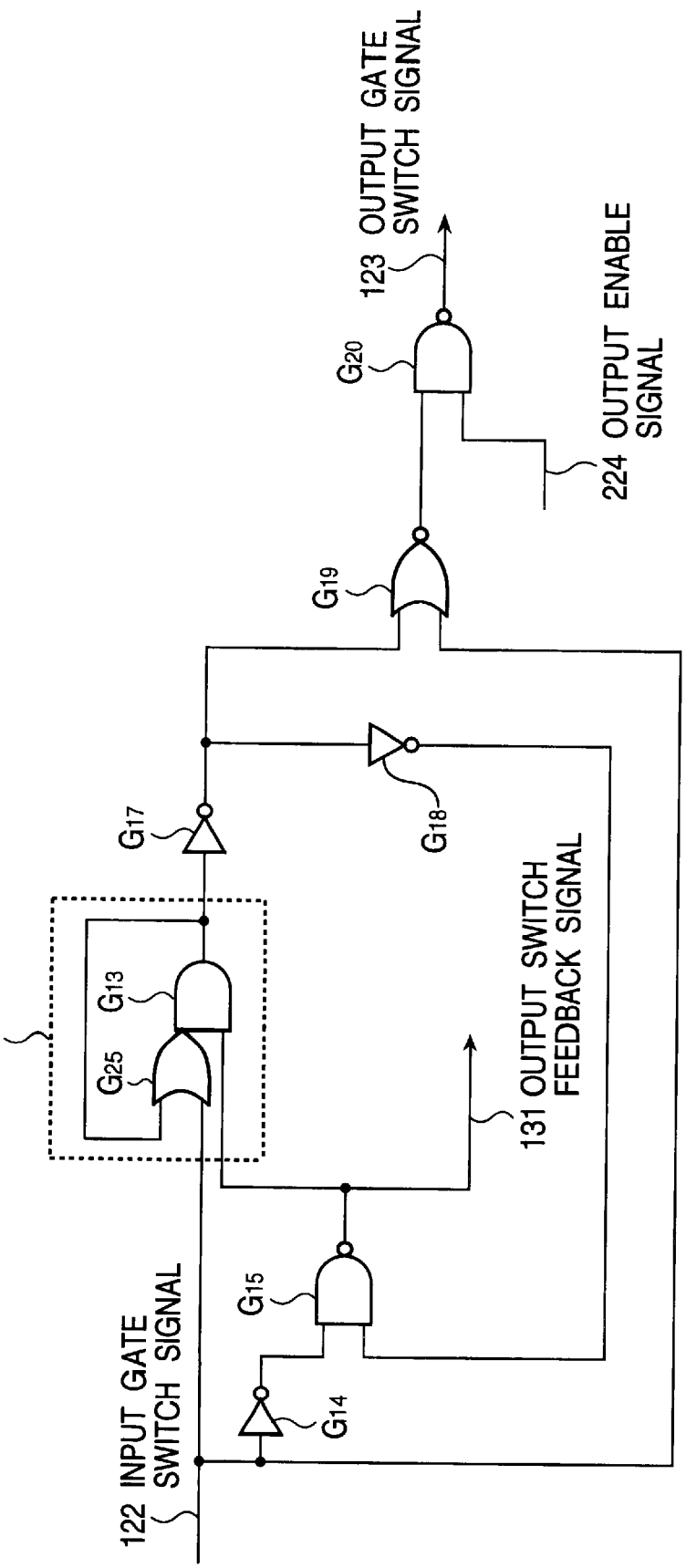
FIG. 10 is a circuit diagram of an example of the output gate control circuit incorporated in the embodiment of the synchronous DRAM in accordance with the present invention.

Referring to FIG. 10, there is shown a circuit diagram of an example of the output gate control circuit 112A incorporated in the embodiment of the synchronous DRAM in accordance with the present invention. In FIG. 10, signals corresponding to those shown in FIG. 5 are given the same Reference Numerals. Although not shown in FIG. 5, the input gate switch signal 122 is supplied to the output gate control circuit shown in FIG. 10.

As shown in FIG. 10, the output gate control circuit 112A comprises a latch 1023, inverters G14, G17 and G18, NAND gates G15 and G20, and a NOR gate G19, which are connected as shown. The latch 1023 is composed of an AND gate G13 and an OR gate G25 connected as shown.

Now, operation of the input gate control circuit and the output gate control circuit will be described with reference to FIGS. 9 and 10.

In FIG. 9, the reset signal 1004 is maintained at a high level before the operation enters the reading operation, so that various nodes are maintained at a reset level for the purpose of preventing malfunction. Namely, a node 1006 is maintained at a high level, and a node 1007 is maintained at a low level. Furthermore, a node 1008 is maintained at a high level, and the input gate switch signal 122 is maintained at a low level. Thus, the input gate control circuit 111A is maintained in an initial condition.

If the read command is supplied to the synchronous DRAM, the reset signal 1004 is brought to the low level, so that the latches 1020, 1021 and 1022, and the NAND gate G5 are put into an enabled condition. In this condition, the same time as the first data starts to be transferred, the activation signal 210, which was maintained at the low level by the burst control circuit 105, is brought to the high level in the form of a one-shot pulse, so that the latch 1021 latches the high level, and therefore, the node 1007 is maintained at the high level.

Furthermore, at the same time as the first data is transferred to the input gate 113 of the register 135, the data output signal 215, which was maintained at the high level by the data amplifier 110, is brought to the low level in the form of a one-shot pulse, so that the latch 1022 latches the high level, and therefore, the node 1008 is maintained at the high level.

At this time, since the nodes 1007 and 1006 and the output switch feedback signal 131 are at the high level, the NAND gate G4 outputs a low level. Therefore, the NAND gate G8 outputs a high level, and since the node 108 is at the high level, the NAND gate G10 outputs the low level. In response to the low level output of the NAND gate G10, the high level latching of the latch 1021 is released, so that the node 1007 is brought to the low level. As a result, the NAND gate G4 outputs a high level, so that the NAND gate G5 outputs a low level. Accordingly, the AND gate G22 generates the input gate switch signal 122 in the form of a positive one-shot pulse having the pulse width corresponding to a delay time of the delay circuit D2, in cooperation with the inverter G21 and the delay circuit D2.

Thus, at the same time as the first data is transferred to the input gate 113 of the register 135, the first data passes through the input gate 113, and then, the input gate switch signal 122 is returned to the low level, so that the first data is held in the register 135.

Thereafter, the output gate control circuit 112A shown in FIG. 10 operates in response to the input gate switch signal and hence the clock signal.

In an initial condition of the output gate control circuit 112A shown in FIG. 10, the input gate switch signal 122 is at the low level, and on the other hand, the output switch feedback signal 131 is at the high level. But, the latch 1023 outputs the low level, so that the NOR gate G19 outputs the low level, and therefore, the output gate switch signal 123 is maintained at the high level.

From this condition, the first data is transferred to the input gate 113 and latched in the register 135 in response to the positive one-shot pulse of the input gate switch signal 122. In response to the positive one-shot pulse of the input gate switch signal 122, the latch 1023 latches the high level. Immediately thereafter, the input gate switch signal 122 is returned to the low level, and on the other hand, the output enable signal 224 is activated to the high level in the form of a one-shot pulse. Thus, the output gate switch signal 123 and the output switch feedback signal 131 are brought to the low level. In response to the low level of the output switch feedback signal 131, the high level latching of the latch 1023 is released so that the latch 1023 outputs the low level, again. Therefore, since the NAND gates G15 and G20 receives the low level, the output gate switch signal 123 and the output switch feedback signal 131 are brought back to the high level at substantially the same timing. Thus, the output gate switch signal 123 and the output switch feedback signal 131 are generated in the form of the negative one-shot pulse.

As a result, the first data is outputted to an external of the synchronous DRAM, and on the other hand, the input gate control circuit 111A shown in FIG. 9 starts a preparing operation for fetching the second data into the register 135.

Here, the preparing operation is important in this embodiment. At the same timing as the first data latched in the register 135 is outputted or transferred through the output gate 114 to the read bus line pair 218 and 219, the activation signal 210 in the form of a one-shot pulse is supplied to the latch 1021 so that the latch 1021 latches the high level. In the input gate control circuit shown in FIG. 9, as a result, the inputs of the NAND gate G4 other than the output switch feedback signal 131 become the high level.

However, an operation of fetching the second data into the register at this timing, namely, of bringing the input gate switch signal 122 to the high level, must be avoided, because the first data is being outputted from the register.

Therefore, since the output switch feedback signal 131 is at the low level, the output of the NAND gate G4 is maintained at the high level, so that the input gate switch signal 122 is maintained at the low level. At this time, since the latch 1020 receives the output switch feedback signal 131, the latch 1020 is in the latched condition of outputting the high level.

When the outputting of the first data from the register is completed, the output gate switch signal 123 and the output switch feedback signal 131 have returned to the high level.

In response to the high level of the output switch feedback signal 131, the NAND gate G4 outputs the low level. Finally, the NAND gate G5 causes the AND gate G22 to generate the input gate switch signal 122 in the form of the positive one-shot pulse, in cooperation with the inverter G21 and the delay circuit D2. Accordingly, the second data is latched in the register 135. On the other hand, at the timing where the second data is transferred to the input gate, since the data output signal 215 is activated in the form of a positive one-shot pulse, the latch 1022 latches the high level, similarly to the first data, and the NAND gate G10 outputs the low level, so that the latch 1021 is released to the low level. Accordingly, the NAND gate G4 outputs the high level, and the NAND gate G5 maintains the input gate switch signal 122 at the low level. Thus, the second data is latched in the register.

Similarly, data succeeding to the second data are latched and outputted. In other words, the same operation is repeated by the number of bits corresponding to the burst length.

In the above mentioned embodiment, the input gate 113 can be replaced with a data amplifier, and the input gate switch signal 122 can be correspondingly replaced with a data amplifier activation signal.

Figure 11:
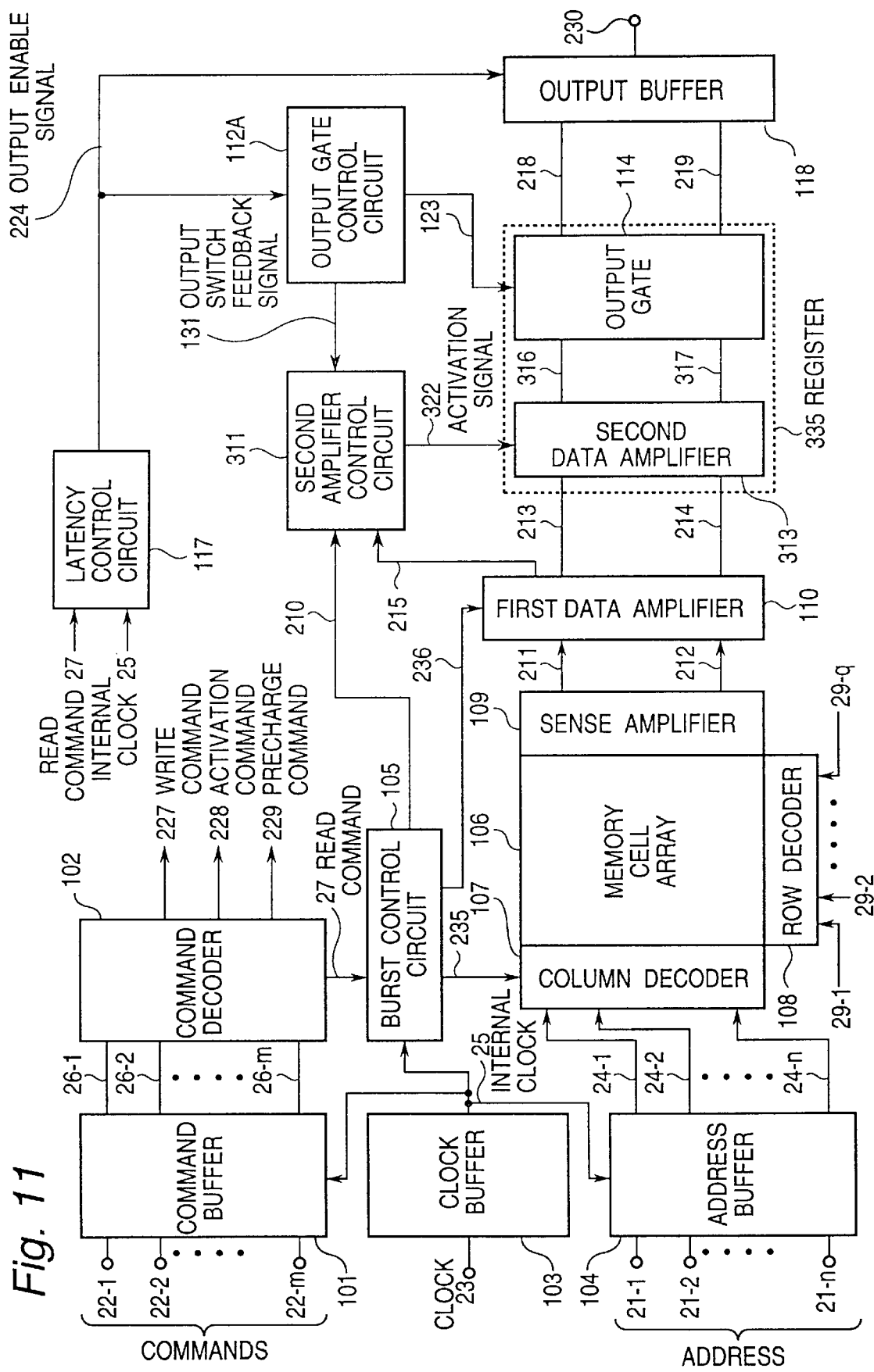
FIG. 11 is a block diagram of illustrating a whole construction of a second embodiment of the synchronous DRAM in accordance with the present invention.

Referring to FIG. 11, there is shown a block diagram of illustrating a whole construction of a second embodiment of the synchronous DRAM in accordance with the present invention. In FIG. 11, elements similar to those shown in FIG. 5 are given the same Reference Numerals, and explanation thereof will be omitted.

As seen from comparison between FIGS. 5 and 11, the second embodiment includes a register 335 in place of the register 135 and a second amplifier control circuit 311 in place of the input gate control circuit 111A. The register 335 includes the output gate 114 and a second data amplifier 313 in place of the input gate 113, and the second amplifier control circuit 311 outputs a second amplifier activation signal 322 to the second data amplifier 313. A pair of outputs 316 and 317 of the second data amplifier 313 are connected to the output gate 114.

Figure 12:
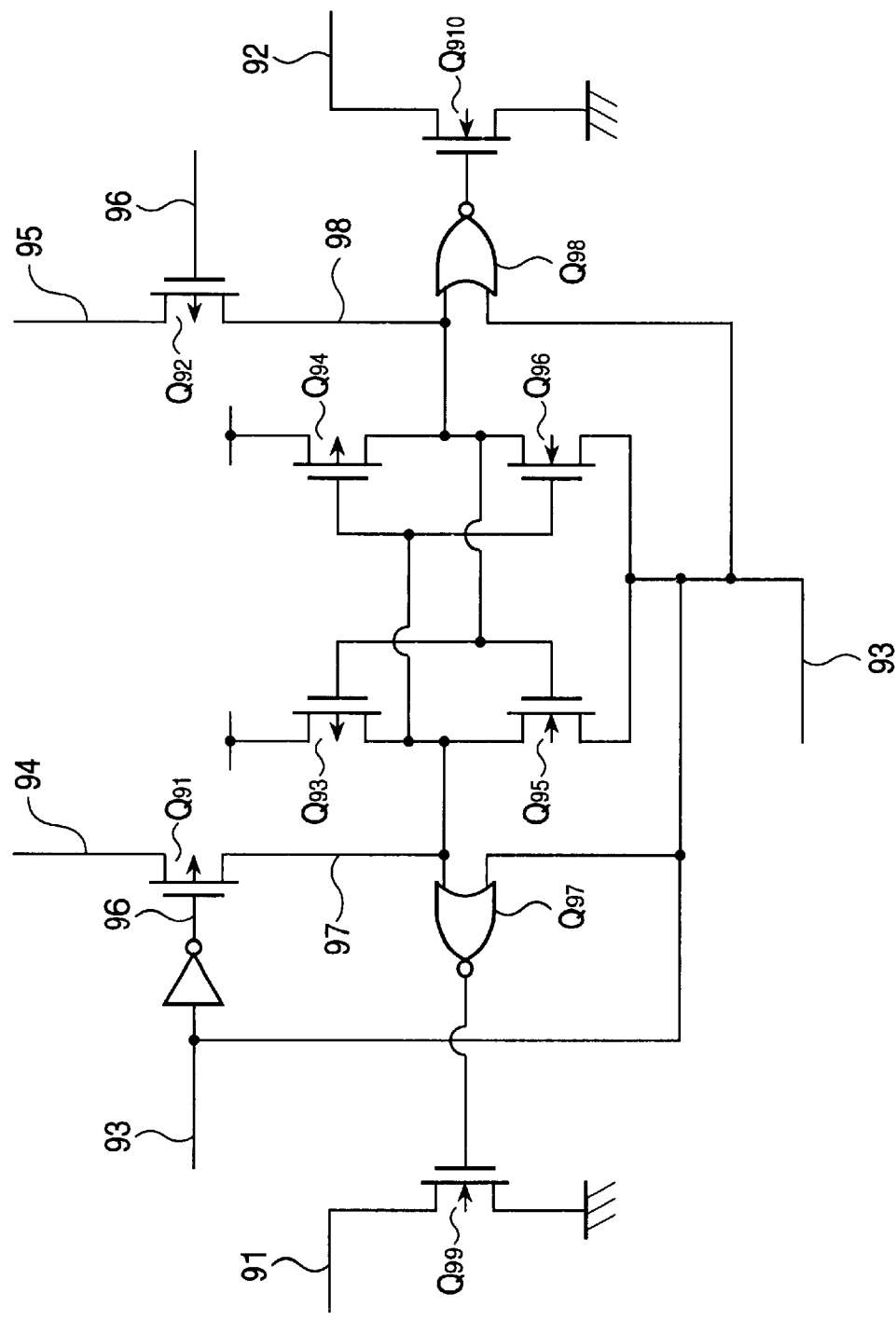
FIG. 12 is a circuit diagram of the data amplifier incorporated in the embodiment of the synchronous DRAM in accordance with the present invention.

Referring to FIG. 12, there is shown a circuit diagram of the data amplifier incorporated in the embodiments of the synchronous DRAM in accordance with the present invention. In FIG. 12, the data amplifier includes a dynamic amplifier composed of PMOS transistors Q93 and Q94 and NMOS transistors Q95 and Q96, connected as shown. Reference Numerals 94 and 95 designate a pair of read/write bus lines (input), and Reference Numeral 93 indicates a data amplifier activation signal. Reference Numerals 91 and 92 designate a pair of read bus lines (output).

In operation, when the data amplifier activation signal 93 is at a high level, a pair of data items on the pair of read/write bus lines (input) 94 and 95 are transferred to a pair of complementary input nodes 97 and 99 of the dynamic amplifier through a pair of transfer gates Q91 and Q92 (PMOS transistors), respectively, controlled by the data amplifier activation signal 93. Thereafter, if the data amplifier activation signal 93 is brought to a low level, the transfer gates Q91 and Q92 are closed so that the transferred data is latched or held on the pair of complementary input nodes 97 and 99 of the dynamic amplifier, and on the other hand, the dynamic amplifier is activated, so that the latched data is amplified. In addition, since NOR gates Q97 and Q98 are enabled by the data amplifier activation signal 93, a pair of complementary amplified data items are respectively outputted from the dynamic amplifier through NOR gates Q97 and Q98 to output NMOS transistors Q99 and Q910 connected to the pair of read bus lines (output) 91 and 92. Thus, the output of the data amplifier is outputted from the NMOS transistors Q99 and Q910 in such a manner that either the read bus line 91 or 92 is pulled down to the low level.

Figure 13:
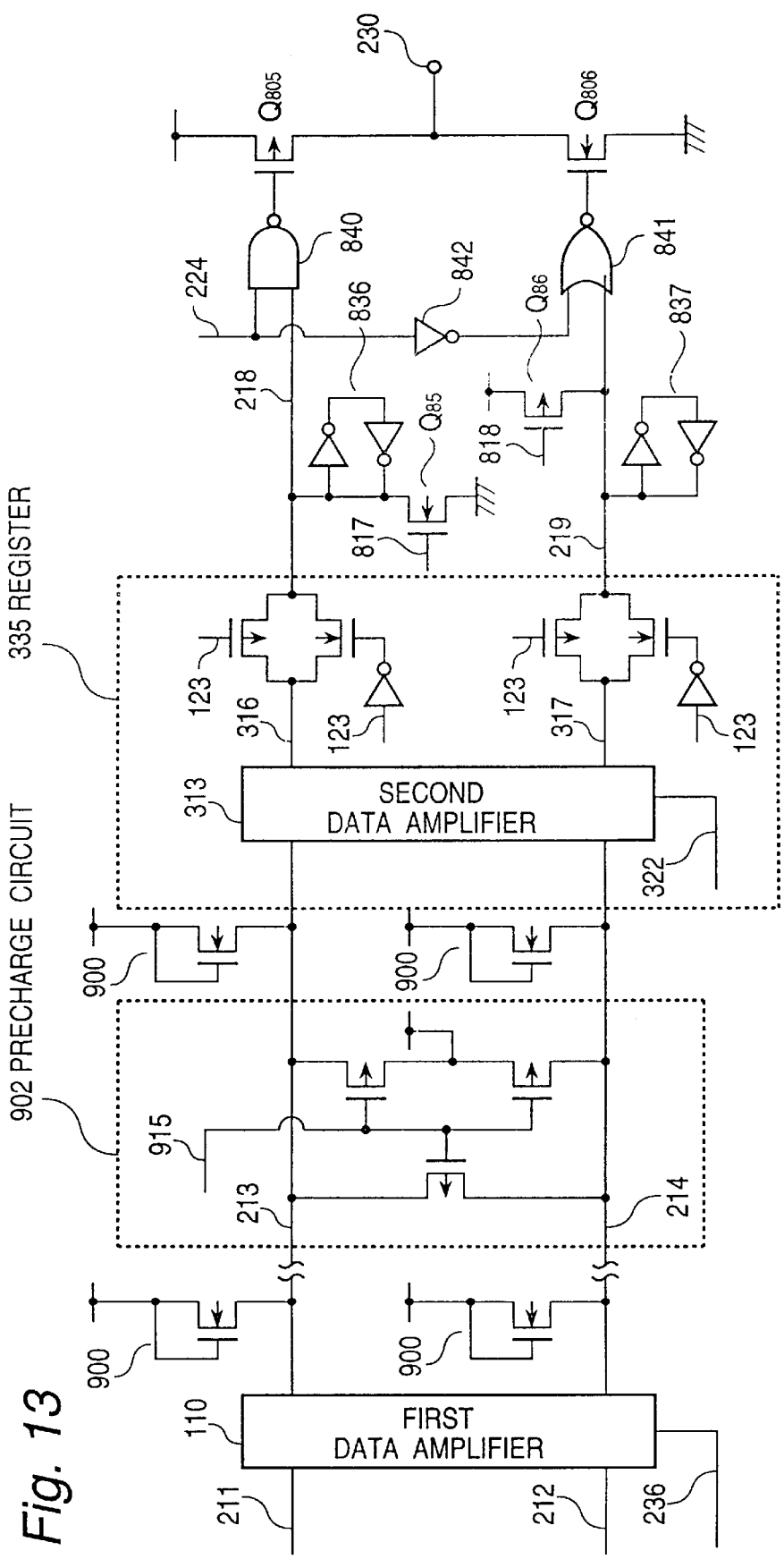
FIG. 13 is a circuit diagram of the register incorporated in the synchronous DRAM shown in FIG. 11.

Referring to FIG. 13, there is shown a circuit diagram of the register 335 which is incorporated in the synchronous DRAM shown in FIG. 11 and which is constituted by using two data amplifiers each of which is the same as that shown in FIG. 12. In FIG. 13, elements and signals similar or corresponding to those shown in FIGS. 6 and 11 are given the same Reference Numerals, and explanation thereof will be omitted. Since the circuit construction shown in FIG. 13 and an operation thereof would be apparent to persons skilled in the art, and since the details of the circuit construction shown in FIG. 13 are not an essence of the present invention, explanation will be limited to the following:

As mentioned hereinbefore and shown in FIG. 12, the output of the data amplifier is outputted from the NMOS transistors Q99 and Q910 in such a manner that either of the read bus lines 91 and 92 in FIG. 12, namely, either of the read bus lines 213 and 214 in FIG. 13, is pulled down to the low level. However, since clamping circuits 900 are connected to opposite ends of each of the read/write bus lines 213 and 214, the level of the read/write bus lines 213 and 214 is prevented from being pulled down to a ground level, and the level of the read/write bus lines 213 and 214 is maintained at a level which is lower than the high level voltage by a threshold of NMOS transistors constituting the clamping circuits 900. With this arrangement, it is possible to reduce the amount of current consumed when the read/write bus line pair 213 and 214 is charged and discharged by a precharge circuit 902 which is connected to the pair of read/write bus lines 213 and 214 and which is controlled by a precharge control signal 915, and also, it is possible to reduce noises generated when the read/write bus line pair 213 and 214 is charged and discharged.

Furthermore, in a standby period in which the data is not transferred, the pair of read/write bus lines 213 and 214 are precharged to the high level by the precharge circuit 902. The other portions shown in FIG. 13 are substantially the same as those shown in FIG. 6.

As seen from the above, the circuit shown in FIG. 6 shows the register 135 in the first embodiment shown in FIG. 5, and the circuits shown in FIGS. 12 and 13 show the register 335 in the second embodiment shown in FIG. 11. Therefore, it would be said that the first embodiment shown in FIG. 5 and the second embodiment shown in FIG. 11 are substantially the same in circuit scale.

Figure 14:
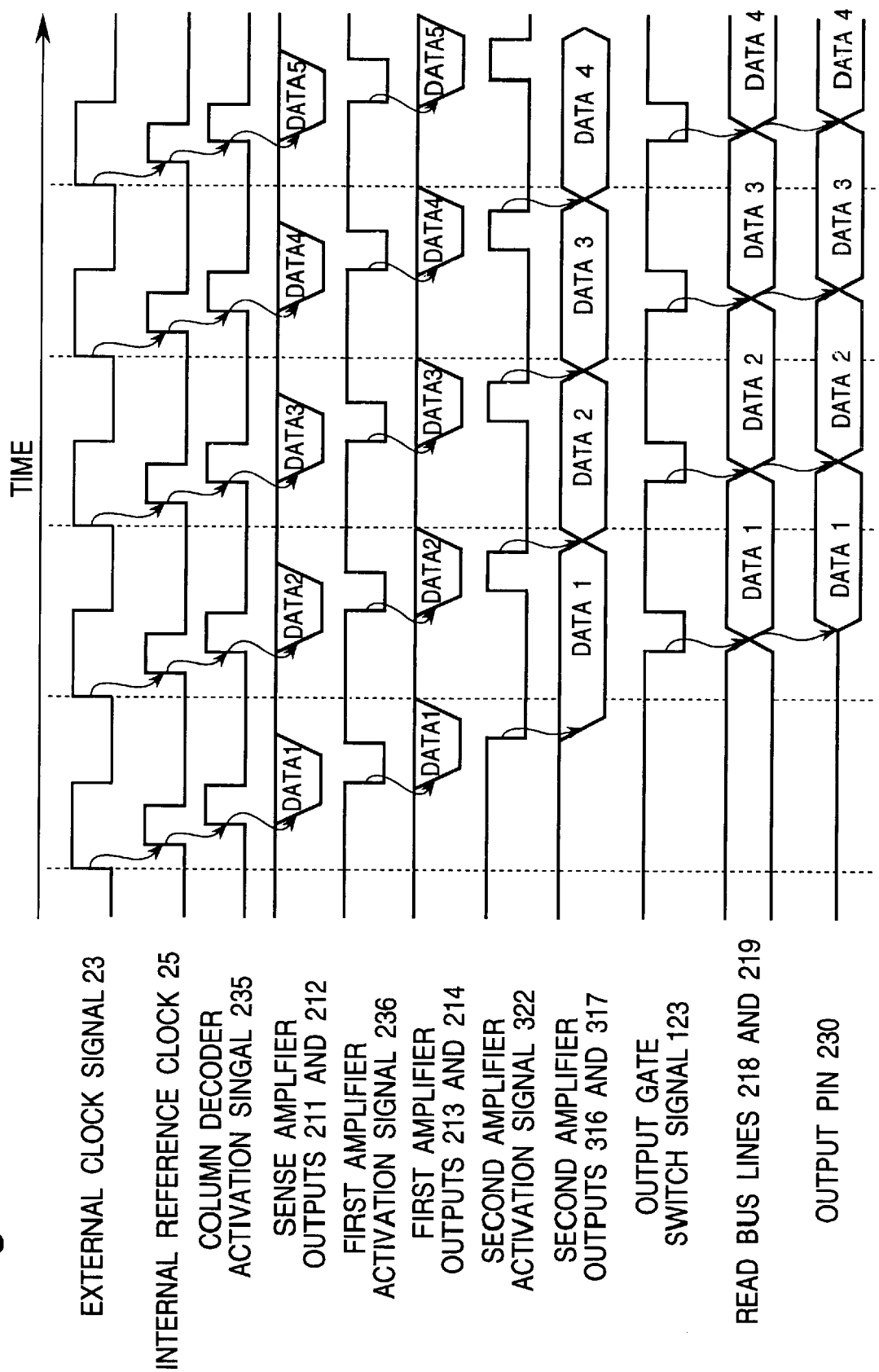
FIG. 14 is a timing chart illustrating an operation of the synchronous DRAM shown in FIG. 11.

Referring to FIG. 14, there is shown a timing chart illustrating an operation of the synchronous DRAM shown in FIG. 11. In FIG. 14, signals corresponding to those shown in FIG. 11 are given the same Reference Numerals.

In response to the external clock signal 23, the internal reference clock 25 is generated by the clock buffer 103, and the column decoder activation signal 235 is generated by the burst control circuit 105 in synchronism with the internal reference clock 25, so that data is read out from the memory cell array 106 and is outputted from the sense amplifier block 109 through the read-out lines 211 and 212 to the first data amplifier 110. The read-out data on the read-out lines 211 and 212 is amplified by the first data amplifier 110 activated in response to the first data amplifier activation signal 236, which is also generated by the burst control circuit 105 in synchronism with the internal reference clock 25.

The read-out data amplified by the first data amplifier 110 is outputted onto the read/write bus lines 213 and 214. The amplified data on the read/write bus lines 213 and 214 is amplified by the second data amplifier 313 activated in response to the second data amplifier activation signal 322, and outputted onto the output lines 316 and 317 of the second data amplifier 313. The amplified data on the output lines 316 and 317 of the second data amplifier 313 is held during the active period (low level period) of the second data amplifier activation signal 322. The amplified data held on the output lines 316 and 317 of the second data amplifier 313 is outputted through the output gate 114 activated by the output gate switch signal 123, to the read bus line pair 218 and 219, and further through the output buffer 118 to the external input/output pin 230.

The flow of the read-out data in the second embodiment of the synchronous DRAM shown in FIG. 11 would be clearly understood from the timing chart of FIG. 14. This second embodiment is characterized in that the high edge timing of the second data amplifier activation signal 322 where the signal 322 changes from the low level to the high level, is later than the timing where the output gate switch signal 123 in the form of a one-shot pulse is outputted to the output gate 114. This second data amplifier activation signal 322 can be obtained from a node 1015 (output of NAND gate G5) in the circuit shown in FIG. 9. Therefore, the second data amplifier control circuit 311 can be constituted by omitting the gates G22 and G22 and the delay circuit D2 from the circuit shown in FIG. 9.

The invention has thus been shown and described with reference to the specific embodiments. However, it should be noted that the present invention is in no way limited to the details of the illustrated structures but changes and modifications may be made within the scope of the appended claims.

As seen from the above, in the synchronous DRAM in accordance with the present invention, the input gate control circuit (or the second data amplifier control circuit) is supplied with the output switch feedback signal in the form of a one-shot pulse generated in synchronism with the output gate switch signal, so that only after the data held in the register has been outputted to an external of the register, namely, after the data transfer operation of the register has been completed, the next data to be succeedingly transferred from the read/write bus to the register is actually latched in the register. With this feature, the two registers which were required for each one input/output pin in the conventional synchronous DRAM having the latency 2, can be reduced to one register. Therefore, in the case of the latency 3 or 4, two registers can be omitted or each one input/output pin.

Therefore, in the synchronous DRAM of ×16 having the latency 2, 16 registers can be omitted, so that the chip area and the cost can be correspondingly reduced.

I claim:

1. A synchronous semiconductor memory so constructed that data is transferred from a data amplifier connected to a sense amplifier connected a memory cell array, through a read/write bus to a register, and then, is transferred to a final output buffer after a predetermined required time so that a first data and a second data are continuously outputted to an external, the synchronous semiconductor memory comprising only one register for receiving and holding the data transferred through said read/write bus from said data amplifier, and means receiving a one-clock-preceding internal clock just before an internal clock giving a reference for outputting said second data from the synchronous semiconductor memory to said external, a first signal indicating that said second data has reached to said register, and a second signal meaning that said first data has been outputted from said register, as an input condition for allowing said second data transferred to said register at a place next to said first data, to be actually latched into said register which holds said first data, said means generating an input control signal to said register when all of said one-clock-preceding internal clock input, said first signal and said second signal are received, so that said second data is actually latched into said register.

2. A synchronous semiconductor memory comprising a memory cell array, a sense amplifier coupled to said memory cell array, a data amplifier connected to an output of said sense amplifier, a register connected through a read/write bus to an output of said data amplifier, and an output buffer connected to an output of said register, so that data read out from said memory cell array is transferred through said sense amplifier and said data amplifier to said register, and held in said register, and thereafter, outputted from said register through said output buffer, whereby data of a predetermined burst length is continuously read out and outputted from the synchronous semiconductor memory, wherein said register includes an input gate means having an input connected to said read/write bus, and an output gate means having an input connected to an output of said input gate means and an output connected to said output buffer, and wherein the synchronous semiconductor memory further includes a first control means for opening said input gate means to receive data on said read/write bus and for closing said input gate means to latch the received data between said input gate means and said output gate means, and a second control means for opening said output gate means to transfer the data latched between said input gate means and said output gate means, to said output buffer and for closing said output gate means to maintain the data between said input gate means and said output gate means, in a held condition, said first control means being configured to open said input gate means only when the data latched between said input gate means and said output gate means has been outputted to said output buffer and when a succeeding data to be latched next in said register has been outputted on said read/write bus.

3. A synchronous DRAM claimed in claim 2 wherein said second control means generates an output gate open signal to said output gate means for opening said output gate means and also generates an output gate feedback signal at substantially the same time as said output gate open signal, and said data amplifier generates a read-out data output signal indicating that data read out from said memory cell array has been outputted from said data amplifier, and wherein said first control means receives said output gate feedback signal and said read-out data output signal, and generates an input gate open signal to said input gate means to open said input gate means only when a first data has been outputted from said register and a second data read out from said memory cell array has been outputted from said data amplifier, thereby to cause said second data to be actually latched into said register.

4. A synchronous DRAM claimed in claim 3 wherein said second control means receives said input gate open signal to generate said output gate open signal and said output gate feedback signal only after said second data has been actually latched into said register.

5. A synchronous DRAM claimed in claim 2 wherein said input gate means is composed of an input transfer gate connected to said read/write bus, and said output gate means is composed of an output transfer gate connected between said input transfer gate and said output buffer.

6. A synchronous DRAM claimed in claim 5 wherein said second control means generates an output gate open signal to said output transfer gate for opening said output transfer gate and also generates an output gate feedback signal at substantially the same time as said output gate open signal, and said data amplifier generates a read-out data output signal indicating that data read out from said memory cell array has been outputted from said data amplifier, and wherein said first control means receives said output gate feedback signal and said read-out data output signal, and generates an input gate open signal to said input transfer gate to open said input transfer gate only when a first data has been outputted from said register and a second data read out from said memory cell array has been outputted from said data amplifier, thereby to cause said second data to be actually latched into said register.

7. A synchronous DRAM claimed in claim 6 wherein said second control means receives said input gate open signal to generate said output gate open signal and said output gate feedback signal only after said second data has been actually latched into said register.

8. A synchronous DRAM claimed in claim 2 wherein said input gate means is composed of a second data amplifier having an input connected to said read/write bus, and said output gate means is composed of an output transfer gate connected between an output of said second data amplifier and said output buffer.

9. A synchronous DRAM claimed in claim 8 wherein said second control means generates an output gate open signal to said output transfer gate for opening said output transfer gate and also generates an output gate feedback signal at substantially the same time as said output gate open signal, and said data amplifier generates a read-out data output signal indicating that data read out from said memory cell array has been outputted from said first named data amplifier, and wherein said first control means receives said output gate feedback signal and said read-out data output signal, and generates a second data amplifier activation signal to said second data amplifier only when a first data has been outputted from said register and a second data read out from said memory cell array has been outputted from said first named data amplifier, thereby to cause said second data to be actually latched into said register.

10. A synchronous DRAM claimed in claim 9 wherein said second control means receives said second data amplifier activation signal to generate said output gate open signal and said output gate feedback signal only after said second data has been actually latched into said register.

* * * * *